(12) United States Patent
Duncan et al.

(10) Patent No.: US 9,558,954 B2
(45) Date of Patent: Jan. 31, 2017

(54) SELECTIVE WET ETCHING AND TEXTURED SURFACE PLANARIZATION PROCESSES

(75) Inventors: Scott W. Duncan, Andover, MA (US); Hong Lu, Wayland, MA (US)

(73) Assignee: Luminus Devices, Inc., Woburn, MA (US)

( * ) Notice: Subject to any disclaimer, the term of this patent is extended or adjusted under 35 U.S.C. 154(b) by 532 days.

(21) Appl. No.: 13/092,464

(22) Filed: Apr. 22, 2011

(65) Prior Publication Data

US 2011/0263128 A1    Oct. 27, 2011

Related U.S. Application Data

(60) Provisional application No. 61/343,000, filed on Apr. 22, 2010.

(51) Int. Cl.
*H01L 21/306* (2006.01)
*H01L 33/22* (2010.01)
*H01L 33/00* (2010.01)

(52) U.S. Cl.
CPC ..... *H01L 21/30612* (2013.01); *H01L 33/0079* (2013.01); *H01L 33/22* (2013.01)

(58) Field of Classification Search
USPC ......................................................... 438/745
See application file for complete search history.

(56) References Cited

U.S. PATENT DOCUMENTS

| 6,831,302 | B2 | 12/2004 | Erchak et al. | |
| 2004/0259279 | A1 | 12/2004 | Erchak et al. | |
| 2005/0059178 | A1 | 3/2005 | Erchak et al. | |
| 2005/0059179 | A1 | 3/2005 | Erchak et al. | |
| 2007/0085098 | A1 | 4/2007 | Erchak et al. | |
| 2008/0121913 | A1* | 5/2008 | McKenzie et al. | 257/98 |
| 2008/0142814 | A1* | 6/2008 | Chu et al. | 257/79 |
| 2008/0149959 | A1* | 6/2008 | Nakamura | H01L 33/22 257/98 |
| 2008/0241978 | A1* | 10/2008 | Erchak et al. | 438/28 |
| 2009/0039367 | A1* | 2/2009 | Iso | H01L 33/0079 257/98 |
| 2009/0278233 | A1* | 11/2009 | Pinnington et al. | 257/615 |

(Continued)

*Primary Examiner* — Allan Olsen
*Assistant Examiner* — Margaret D Klunk
(74) *Attorney, Agent, or Firm* — Wolf, Greenfield & Sacks, P.C.

(57) ABSTRACT

The present invention relates to systems and methods associated with selective wet etching and textured surface planarization. The systems and methods described herein can be used to etch a component of a multi-layer stack, such as a GaN layer. In some embodiments, the multi-layer stack can include a substrate having a patterned surface and a light generating region. The substrate can be removed from the first multi-layer stack to form a second multi-layer stack. In some embodiments, the pattern on the surface of the substrate can leave behind a pattern on a surface of the second multi-layer stack. Accordingly, in some cases, the surface of the second multi-layer stack can be wet etched, for example, to smoothen the surface. In some embodiments, removing the substrate can expose an N-face of a GaN layer, and the wet etch can be performed such that the N-face of the GaN layer is etched. In some embodiments, the multi-layer stack includes a light generating region and can be part of a light emitting device.

9 Claims, 7 Drawing Sheets

(56) References Cited

U.S. PATENT DOCUMENTS

2012/0017825 A1\* 1/2012 D'Evelyn et al. .............. 117/58
2012/0037883 A1\* 2/2012 Jiang et al. .................... 257/13
2012/0205665 A1\* 8/2012 Nam ................... H01L 29/2003
　　　　　　　　　　　　　　　　　　　　　　　257/76

\* cited by examiner

SELECTIVE WET ETCHING AND TEXTURED SURFACE PLANARIZATION PROCESSES

RELATED APPLICATIONS

This application claims priority under 35 U.S.C. §119(e) to U.S. Provisional Patent Application No. 61/343,000, filed Apr. 22, 2010, and entitled "Selective GaN wet etch and textured surface planarization process," which is incorporated herein by reference in its entirety for all purposes.

FIELD OF INVENTION

Systems and methods associated with selective wet etching and textured surface planarization processes are generally described. In some embodiments, the systems and methods described herein can be used to process gallium nitride.

BACKGROUND

Gallium nitride (GaN) is a binary III/V bandgap semiconductor material and can be used in a wide variety of devices including light-emitting diodes, laser diodes, UV detectors, and other electronic devices such as field-effect transistors (FETs), high electron mobility transistors (HEMTs), and heterojunction bipolar transistors (HBTs). GaN is also a very hard material, and is stable with a high heat capacity. GaN can be doped with several materials to either form an n-type or p-type semiconductor, which, when used together, can form the structure for a light-emitting diode.

SUMMARY OF THE INVENTION

Systems and methods associated with selective wet etching and textured surface planarization processes are provided.

In one aspect, a method is provided. In some embodiments, the method comprises providing a first multi-layer stack, comprising a substrate including a patterned surface and a light generating region. In some embodiments, the method comprises removing the substrate from the first multi-layer stack to form a second multi-layer stack, and wet etching a surface of the second multi-layer stack.

In one set of embodiments, the method comprises providing a multi-layer stack comprising a GaN layer and an underlying material, removing at least a portion of the underlying material to expose an N-face of the GaN layer, and wet etching the N-face of the GaN layer.

Other advantages, novel features, and objects of the invention will become apparent from the following detailed description of the invention when considered in conjunction with the accompanying drawings, which are schematic and which are not intended to be drawn to scale. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

The present invention relates to systems and methods associated with selective wet etching and textured surface planarization. The systems and methods described herein can be used to etch a component of a multi-layer stack, such as a GaN layer. In some embodiments, the multi-layer stack can include a substrate having a patterned surface and a light generating region. The substrate can be removed from the first multi-layer stack to form a second multi-layer stack. In some embodiments, the pattern on the surface of the substrate can leave behind a pattern on a surface of the second multi-layer stack. Accordingly, in some cases, the surface of the second multi-layer stack can be wet etched, for example, to smoothen the surface. In some embodiments, removing the substrate can expose an N-face of a GaN layer, and the wet etch can be performed such that the N-face of the GaN layer is etched. In some embodiments, the multi-layer stack includes a light generating region and can be part of a light emitting device.

Although the primary description below involves selective wet etching and texture surface planarization in relation to light emitting devices, it is to be understood that the systems and methods of the invention can be used in other electronic devices or any other devices that employ GaN.

Figure 1:
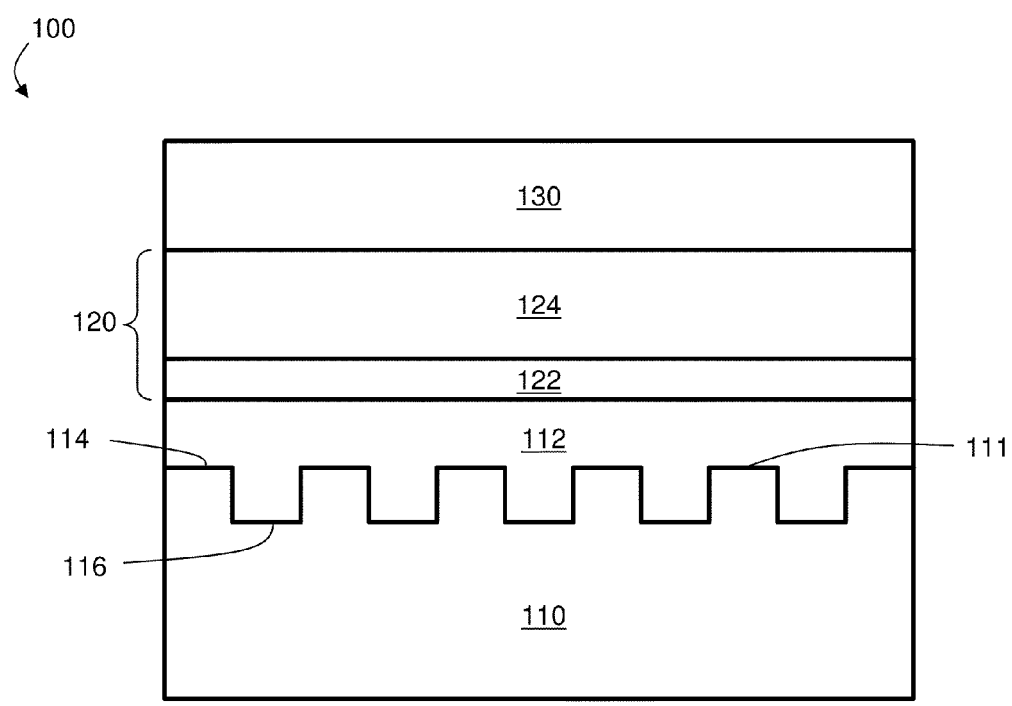
FIG. 1 includes a cross-sectional schematic illustration of a multi-layer stack, according to one set of embodiments.

FIG. 1 illustrates a multi-layer stack 100 including substrate 110 and GaN layer 112. Substrate 110 includes a patterned surface 111. Surface 111 can include any suitable pattern. For example, in the set of embodiments illustrated in FIG. 1, surface 111 includes an arrangement of protrusions 114 and indentations 116. Protrusions can be in the form of, for example, posts. Indentations can be in the form of, for example, holes, trenches, and/or any other suitable structure.

All or part of substrate 110 can be formed of a high bandgap substrate such as sapphire (e.g., a c-plane sapphire substrate), AN, or any other suitable high bandgap material. In some embodiments, substrate 110 can be formed of silicon and/or silicon carbide. In some embodiments, GaN layer 112 is grown on substrate 110, and patterned surface 111 can reduce the number and/or size of defects formed in the GaN layer, relative to an amount that would be present in the absence of the pattern.

In some embodiments, GaN layer 112 can be an n-doped GaN layer. In one embodiment, GaN layer 112 is an n-doped GaN layer, having a doping concentration of about $10^{18}$ cm$^{-3}$. In other embodiments, GaN layer 112 can be an undoped GaN layer or a p-doped GaN layer.

Additional layer(s) 120 may be disposed over the GaN layer 112, in some embodiments. Layer(s) 120 can include layers that can serve as device structure layers (e.g., light emitting diode and/or laser diode layers). In one embodiment, layer(s) 120 include one or more p-doped layers, one or more n-doped layers, and/or one or more active layers (e.g., such as one or more quantum wells). In some embodiments, at least a portion of layers 120 can comprise a light generating region.

In some embodiments, layer(s) 120 can include an active layer 122, which can include one or more quantum wells (e.g., an InGaN/GaN multi-quantum well structure). Layer(s) 120 can include a layer 124 that can be disposed over the active layer 122. Layer 124 can include a p-doped layer. In some embodiments, layer 124 can include a GaN layer (e.g., a p-doped GaN layer).

Multi-layer stack 100 can include a submount 130, in some embodiments. Submount 130 can be used to provide support to a portion of the multi-layer stack, for example, a portion that is left behind when substrate 110 is removed (as described in more detail below). The submount can be bonded to the other layers of the multi-layer stack, in some embodiments. In other embodiments, a submount may be formed (e.g., electroformed, evaporated) on an exposed surface of rest of the layers within multi-layer stack 100 (e.g., over layer 124). Part or all of submount 210 can be electrically conductive and/or thermally conductive. In some embodiments, submount 210 can include a metal (e.g., copper, aluminum, copper-tin alloy).

In some embodiments, it may be desirable to separate substrate 110 from the rest of multi-layer stack 100 to form a second multi-layer stack. Separation of substrate 110 from multi-layer stack 100 can be achieved, for example, using a laser liftoff process. In some embodiments, a laser liftoff process may be performed by transmitting a small wavelength of electromagnetic radiation through the high bandgap substrate. Some embodiments may utilize laser liftoff processes and structures described in commonly-owned U.S. Patent Application Publication Nos. 20050059179 and 20050059178, which are incorporated herein by reference.

To illustrate one exemplary substrate removal process, the backside of substrate 110 can be illuminated with electromagnetic radiation having a wavelength which is not absorbed by the substrate. The electromagnetic radiation can originate from any suitable source such as a laser and/or a lamp. In some embodiments, the electromagnetic radiation can have a wavelength less than 250 nm, for example UV light (e.g., from a 248 nm UV laser or lamp).

GaN layer 112 may have a bandgap such that electromagnetic radiation having a wavelength that is transmitted by the substrate 110 is absorbed at the bottom interface of GaN layer 112 (e.g., the interface of layer 112 and substrate 110). In some embodiments, a portion of GaN layer 112 (e.g., a portion having a thickness less than 1000 nm, less than 750 nm, less than 500 nm, or less than 250 nm) can be used as a sacrificial layer. In some such embodiments, removing the substrate from multi-layer stack 100 comprises decomposing at least a portion of the sacrificial layer. For example, electromagnetic radiation can be absorbed by the sacrificial portion, and the absorbed radiation can heat up the interface causing liquefaction of material. Heating GaN layer 112 can result in the decomposition of the GaN into nitrogen gas and liquid gallium. After decomposing at least a portion of the sacrificial layer, substrate 110 can be removed to expose a surface of GaN layer 112. In some embodiments, removing substrate 110 can expose an N-face of GaN layer 112.

Figure 2:
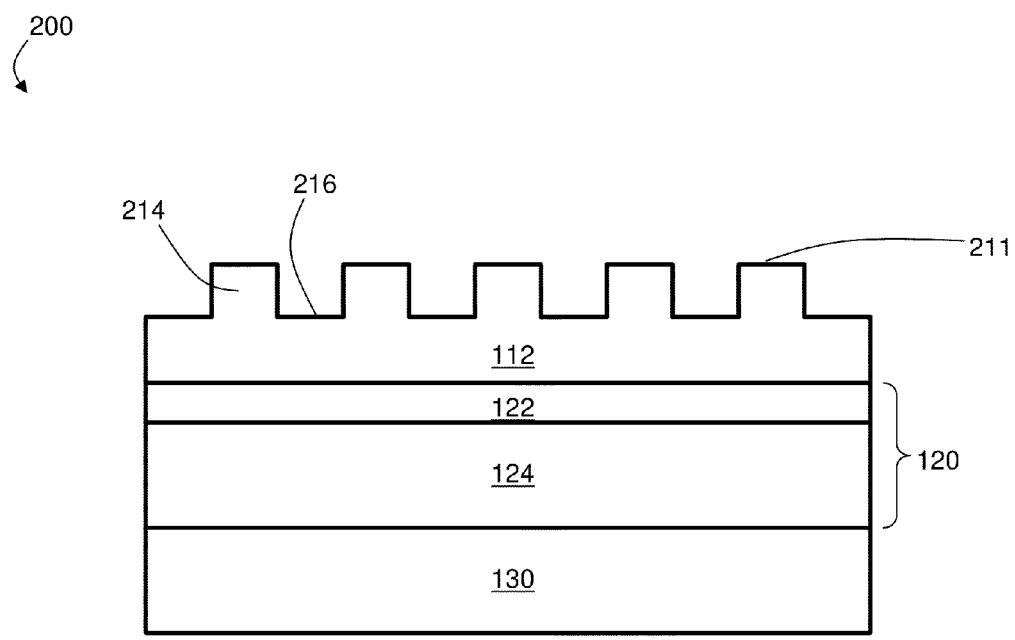
FIG. 2 includes, according to one set of embodiments, another exemplary cross-sectional schematic illustration of a multi-layer stack.

FIG. 2 illustrates a second multi-layer stack 200, which can be formed by removing substrate 110 from multi-layer stack 100 as illustrated in FIG. 1 and rotating the multi-layer stack such that submount 130 is located at the bottom. In FIG. 2, GaN layer 112 includes a patterned surface 211. In this set of embodiments, GaN layer 112 includes protrusions 214 and indentations 216, which substantially correspond to the indentations 116 and protrusions 114, respectively, of substrate 110 in FIG. 1. In some embodiments, the exposed surface of GaN layer 112 can be the N-face of the GaN layer.

In some embodiments, a surface of the second multi-layer stack, such as GaN layer 112, can be wet etched. The surface of the second multi-layer stack that is wet etched can be the surface that is exposed upon removal of the substrate. For example, in FIG. 2, the top surface of GaN layer 112 can be wet etched, for example, to planarize the top surface.

Wet etching can be preferred over other etching and polishing techniques for a variety of reasons. For example, wet etching does not create ion-induced damage and is often better at creating smoother sidewalls and surfaces, relative to dry etching processes such as plasma etching. In addition, wet etching is generally less complicated and less expensive than chemical mechanical polishing. Accordingly, in some embodiments, substantially all of the etching of the surface of the GaN layer is achieved via wet etching. In some embodiments, the wet etching process is performed in the substantial absence of dry etching. In some cases, the wet etching process is performed in the substantial absence of mechanical polishing (e.g., mechanical polishing that would be observed in a chemical mechanical polishing process). In some embodiments, the wet etching process is performed in the substantial absence of dry etching and in the substantial absence of mechanical polishing.

In some embodiments, wet etching comprises exposing a surface (e.g., an N-face of a GaN layer) to an etchant comprising an acid and/or an oxidizing agent. Suitable acids for use in the etchant include, but are not limited to, phosphoric acid ($H_3PO_4$) and/or nitric acid ($HNO_3$). Suitable oxidants for use in the etchant include, but are not limited to hydrogen peroxide ($H_2O_2$) and/or nitric acid. In some embodiments, the etchant comprises phosphoric acid and hydrogen peroxide. The ratio of phosphoric acid to hydrogen peroxide, by volume, within the etchant can be between about 3:1 and about 60:1, between about 5:1 and about 45:1, between about 10:1 and about 20:1, or between about 12:1 and about 16:1. In some embodiments, the etchant can also include a diluent such as water. The diluent can be used to control the strength of the etchant, for example, to control the etch rate.

In some embodiments, the wet etching can be performed at a relatively low temperature. The use of a low-temperature etchant can be advantageous as it can reduce the energy required to heat the etchant as well as make the etchant more safe to use. In some embodiments, the wet etching is performed using an etchant at a temperature of less than about 100° C., less than about 85° C., between about 50° C. and about 100° C., between about 75° C. and about 90° C., or between about 80° C. and about 85° C. While the wet etching step can be performed at the relatively low temperatures mentioned above, it should be understood that, in other embodiments, the wet etching step can be performed at relatively high temperatures (e.g., at temperatures up to 200° C. or higher).

Relatively fast etching rates can be achieved using the wet etching processes described herein. For example, in some embodiments, the surface of the second multi-layer stack (e.g., the N-face of a GaN layer) is etched, in a direction perpendicular to the surface (i.e., in a vertical direction), at a rate of at least about 0.01 micrometers/hour, at least about 0.1 micrometers/hour, at least about 0.5 micrometers/hour, between about 0.01 micrometers/hour and about 0.8 micrometers/hour, between about 0.1 micrometers/hour and about 0.8 micrometers/hour, or between about 0.5 micrometers/hour and about 0.8 micrometers/hour. In some embodiments, the surface of the second multi-layer stack (e.g., the N-face of a GaN layer) is etched, in a direction parallel to the surface (i.e., in a horizontal direction), at a rate of at least about 0.01 micrometers/hour, at least about 0.1 micrometers/hour, at least about 1 micrometer/hour, between about 0.01 micrometers/hour and about 2 micrometers/hour, between about 0.1 micrometers/hour and about 2 micrometers/hour, or between about 1 micrometer/hour and about 2 micrometers/hour. The etch rate can be adjusted by adding a diluent such as water to the etchant solution.

The wet etching process can be used to produce a relatively smooth surface. For example, in some embodiments, after wet etching the surface of the second multi-layer stack, the surface has an RMS roughness of at most about 50 nanometers, at most about 25 nanometers, at most about 10 nanometers, at most about five nanometers, or at most about one nanometer. In some embodiments, after wet etching the surface of the second multi-layer stack, the surface has a flatness of at most about 10 microns per 6.25 square centimeters, at most about five microns per 6.25 square centimeters, or at most about one micron per 6.25 square centimeters.

Not wishing to be bound by any particular theory, it is believed that, during the wet etching step, the surface of the etched layer is first oxidized by the oxidant (e.g., in a GaN layer, the gallium is oxidized to gallium oxide and the nitrogen is oxidized to an oxide of nitrogen), the oxidized species are dissolved by the acid to produce freshly exposed surfaces, and the freshly exposed surfaces are subsequently oxidized by the oxidant. It is believed that this process repeats itself to produce a smoothened surface.

In some embodiments, a mask can be employed to protect one or more portions of the GaN surface from the etchant. Suitable mask materials include, but are not limited to, silicon oxides (e.g., $SiO_2$), silicon nitrides (e.g., $Si_3N_4$, $SiN_x$, etc.), and photoresists.

One of the advantages of the systems and methods described herein is that they can be used to etch the N-face of a GaN layer. In fact, the wet etchants described herein have been shown to have a good etching rate in the N-face c-plane surface of {0001} of GaN layers, whereas other etchants have not etched the N-face, or have etched the N-face only to a negligible degree. Accordingly, in some embodiments, an N-face of a GaN layer can be exposed (e.g., by removing a substrate for example via laser liftoff) and subsequently wet etched.

The systems and methods described herein can be used to form a variety of structures. For example, the etchant can be used to form relatively flat mesa surfaces. The etching process can be used to form 45°-angled slopes (e.g., structures having multiple sloped facets with each facet having an angle of 45°). Such structures may be useful in enhancing light extraction from the emission surface of a light-emitting device such as an LED. In some embodiments, the systems and methods described herein can be used to perform an surface planarization (e.g., surface planarization of an epitaxial layer, such as an epitaxial GaN layer) instead of, for example, using chemical-mechanical polishing (CMP). Planarization can be performed across an entire surface or over one or more portions of a surface (e.g., portions that can be used to support metal contacts). The etching processes described herein can be used to generate a more gentle transitional sloped surface between step heights for more uniform metal film coverage, which can decrease stress fractures that may result in a faulty product. In addition, the etching processes can be used to generate more gently-sloped surfaces for photonic-lattice stamp printing.

Figure 3:
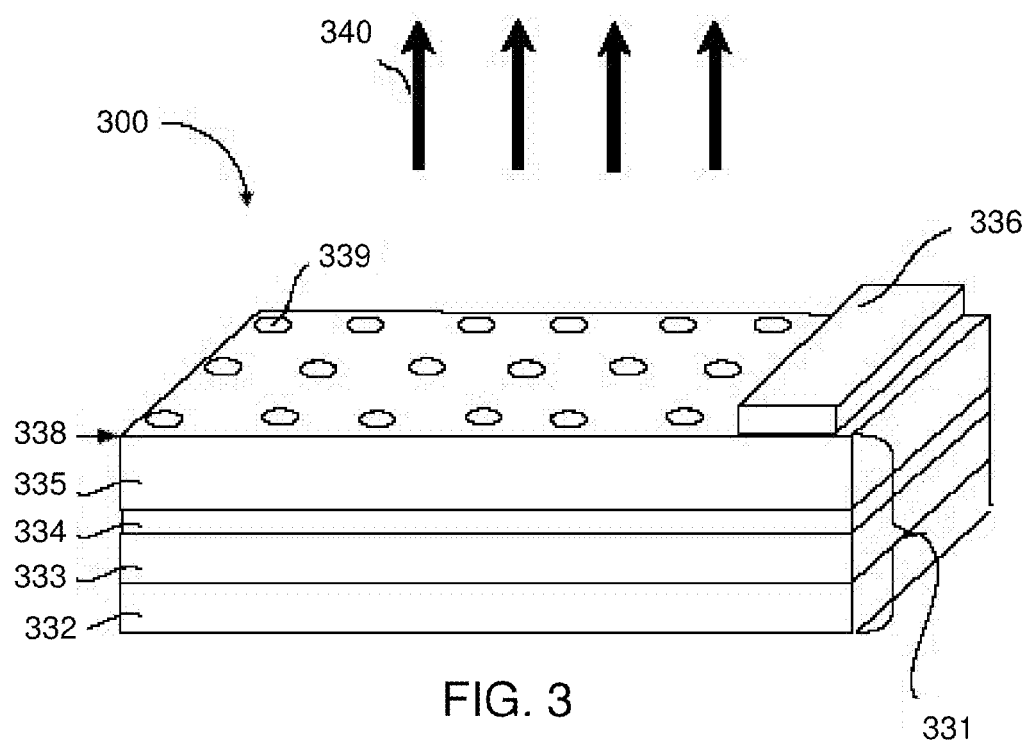
FIG. 3 includes, according to some embodiments, a cross-sectional schematic illustration of an LED.

As noted above, the systems and methods described herein can be used as part of the formation of a variety of electrical devices. FIG. 3 illustrates a light-emitting diode (LED) die that may be formed on a layer transferred structure (e.g., a layer stack formed by processes described herein), in accordance with one embodiment. It should also be understood that various embodiments presented herein can also be applied to other light-emitting devices, such as laser diodes, and LEDs having different structures.

LED 300 shown in FIG. 3 comprises a multi-layer stack 331 that may be disposed on a support structure, such as a submount, as previously described (e.g., for example using a layer transfer process). The multi-layer stack 331 can include an active region 334 which is formed between n-doped layer(s) 335 and p-doped layer(s) 333. The stack can also include an electrically conductive layer 332 which may serve as a p-side contact, which can also serve as an optically reflective layer. An n-side contact pad 336 is disposed on layer 335. It should be appreciated that the LED is not limited to the configuration shown in FIG. 3; for example, the n-doped and p-doped sides may be interchanged so as to form a LED having a p-doped region in contact with the contact pad 336 and an n-doped region in contact with layer 332. As described further below, electrical potential may be applied to the contact pads which can result in light generation within active region 334 and emission of at least some of the light generated through an emission surface 338. As described further below, openings 339 may be defined in a light-emitting interface (e.g., emission surface 338) to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include, for example, GaN.

The n-doped layer(s) 335 can include a silicon-doped GaN layer (e.g., having a thickness of about 4000 nm thick) and/or the p-doped layer(s) 333 include a magnesium-doped GaN layer (e.g., having a thickness of about 40 nm thick). The electrically conductive layer 332 may be a silver layer (e.g., having a thickness of about 100 nm), which may also serve as a reflective layer (e.g., that reflects upwards any downward propagating light generated by the active region 334). Furthermore, although not shown, other layers may also be included in the LED; for example, an AlGaN layer may be disposed between the active region 334 and the p-doped layer(s) 333. It should be understood that compositions other than those described herein may also be suitable for the layers of the LED.

As a result of openings 339, the LED can have a dielectric function that varies spatially according to a pattern. The dielectric function that varies spatially according to a pattern can influence the extraction efficiency and/or collimation of light emitted by the LED. In some embodiments, a layer of the LED may have a dielectric function that varies spatially according to a pattern. In the illustrative LED 300, the pattern is formed of openings, but it should be appreciated that the variation of the dielectric function at an interface need not necessarily result from openings. For example, the variation of the dielectric function can be due to a plurality of protrusions left behind by a GaN etching process, as described above. Any suitable way of producing a variation in dielectric function according to a pattern may be used. For example, the pattern may be formed by varying the composition of layer 335 and/or emission surface 338. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety. A high extraction efficiency for an LED implies a high power of the emitted light and hence high brightness which may be desirable in various optical systems. It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. patent application Ser. No. 11/370,220, entitled "Patterned Devices and Related Methods," filed on Mar. 7, 2006, which is herein incorporated by reference in its entirety.

Light 340 may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. The light emitted by the LED may be influenced by any patterned interface through which light passes, whereby the pattern can be arranged so as to influence light extraction and/or collimation.

In some embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high power (e.g., emitted light output power). As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total power of the emitted light divided by the emission area. In some embodiments, the emitted light has a total power flux greater than 0.03 Watts/mm$^2$ (e.g., greater than 0.05 Watts/mm$^2$, greater than 0.1 Watts/mm$^2$, greater than 0.2 Watts/mm$^2$). However, it should be understood that the LEDs used in systems and methods presented herein are not limited to the above-described power and power flux values.

As used herein, an LED may be an LED die, a partially packaged LED die, or a fully packaged LED die. It should be understood that an LED may include two or more LED dies associated with one another, for example a red-light emitting LED die, a green-light emitting LED die, a blue-light emitting LED die, a cyan-light emitting LED die, or a yellow-light emitting LED die. For example, the two or more associated LED dies may be mounted on a common package. The two or more LED dies may be associated such that their respective light emissions may be combined to produce a desired spectral emission. The two or more LED dies may also be electrically associated with one another (e.g., connected to a common ground).

As previously described, the structures presented herein may be used in combination with a layer transfer process, such as a laser liftoff process. A laser lift-off process is described in US Patent Publication 2004/0259279, filed on Mar. 5, 2004, which is hereby incorporated by reference in its entirety.

U.S. Provisional Patent Application No. 61/343,000, filed Apr. 22, 2010, and entitled "Selective GaN wet etch and textured surface planarization process" is incorporated herein by reference in its entirety for all purposes.

The following examples are intended to illustrate certain embodiments of the present invention, but do not exemplify the full scope of the invention.

EXAMPLE 1

This example describes a process for etching an N-faced GaN surface using a wet etchant including phosphoric acid ($H_3PO_4$) and hydrogen peroxide ($H_2O_2$). The etchant was used to remove the undoped GaN layer (uGaN) from a GaN LED after the epitaxial layer was transferred to a submount using a laser lift-off (LLO) process. The LLO process left the N-face of the GaN material exposed.

First, the GaN sample was prepared for etching. An etch-resistant mask was deposited and patterned to define the areas that were to be etched. To form the mask, a layer of $SiO_2$ or $Si_3N_4$ was deposited onto the surface of the LED. In other cases, the $SiO_2$ or $Si_3N_4$ could be replaced with a polymer resistant to $H_3PO_4$ and $H_2O_2$. Next the surface was coated with photoresist and patterned using standard lithographic techniques. Subsequently, the $SiO_2$ or $Si_3N_4$ was etched using either a wet chemical or a plasma chemistry process.

The etchant was prepared by adding 5 parts (by volume) of 85 vol % $H_3PO_4$ (15 vol % water) to 1 part 30 vol % $H_2O_2$ (70 vol % water) in a temperature controlled tank. This produced an etchant with a $H_3PO_4:H_2O_2$ ratio of about 14:1, by volume. The bath temperature was maintained at about 80° C. The temperature could be raised or lowered to adjust the etch rate. After the bath was stabilized at the desired temperature, the samples were inserted into the bath for a period of time. Etch depth was monitored using a standard profilometer. After the etch was complete the $SiO_2$ or $Si_3N_4$ mask layer was either removed or left on the surface.

The process outlined above produced controlled removal of the uGaN layer and exposure of an underlying N-face GaN layer. The process was not affected by the micro-masking issue typically seen when a plasma etch process is used. Non-uniformities on the surface of the GaN layer were reduced or eliminated during the etch step due to the difference in etch rate between crystal faces parallel and perpendicular to the c plane. Although large non-uniformities were eliminated during the etching process, some microscopic non-uniformities remained in some cases.

Figure 4A:
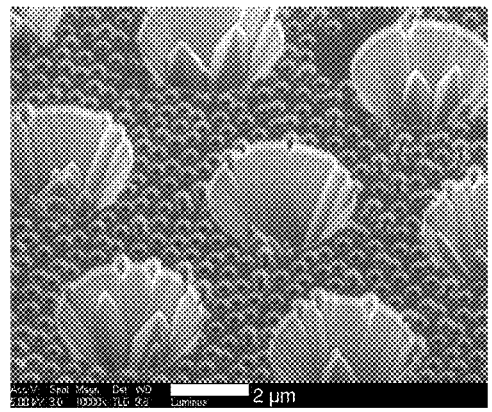
FIGS. 4A-4G include SEM images of an etched GaN surface, according to one set of embodiments.
Figure 4B:
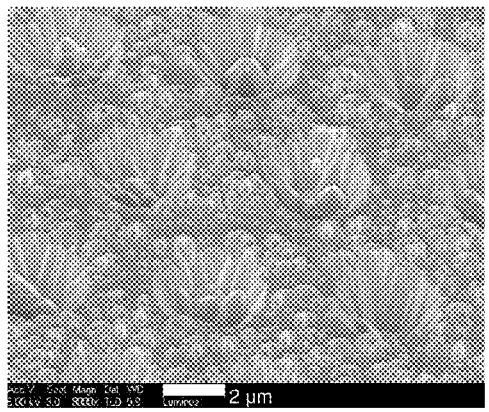
Figure 4C:
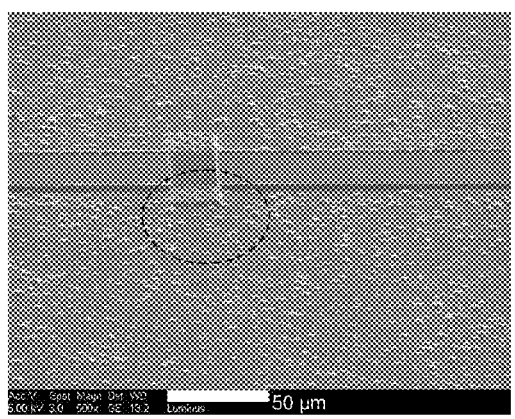
Figure 4D:
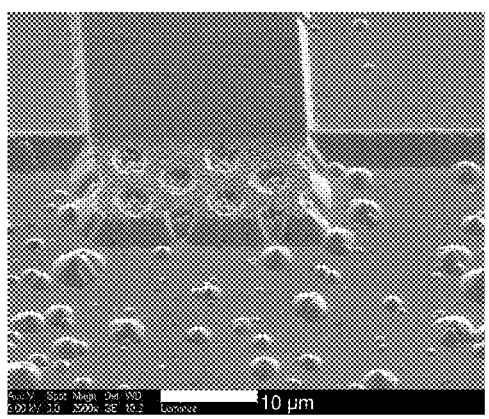
Figure 4E:
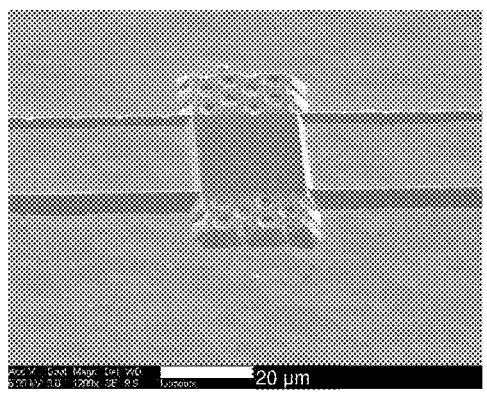
Figure 4F:
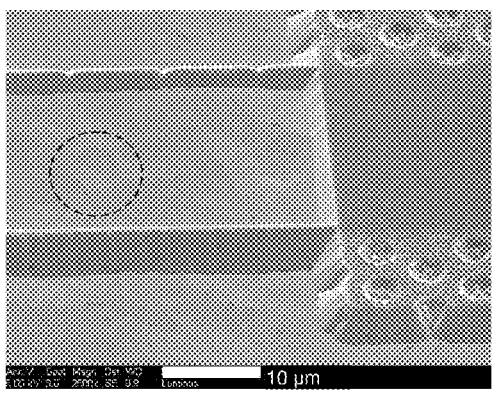
Figure 4G:
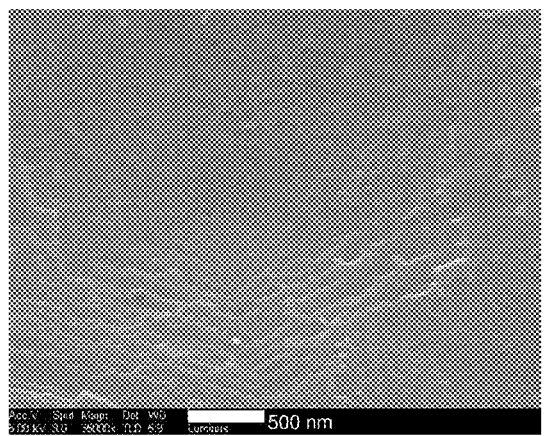

FIG. 4A includes a scanning electron micrograph (SEM) of a patterned N-face surface of a GaN layer prior to exposure to the wet etchant. FIG. 4B includes an SEM of the surface in FIG. 4A after a 7 minute exposure to the $H_3PO_4$/$H_2O_2$ etchant used in this example, at 80° C. FIG. 4C includes an SEM of the surface in FIG. 4A after a 90 minute exposure at 80° C. FIG. 4D includes an SEM image of the surface portion circled in FIG. 4C. As illustrated in FIG. 4D, the portions of the surface protected by the oxide mask remained patterned, while the portions of the surface unprotected by the mask were etched. FIG. 4E includes an SEM image of the surface in FIG. 4C after exposure to the etchant at 80° C. for 120 minutes. FIG. 4F includes an SEM image of the section outlined in dotted lines in FIG. 4E, while FIG. 4G includes an SEM image of the section outlined in dotted lines in FIG. 4F. As can be observed from the images in FIGS. 4E-4G, the patterns in the areas that were not protected by a mask were substantially smooth after the 120 minute exposure.

Figure 5A:
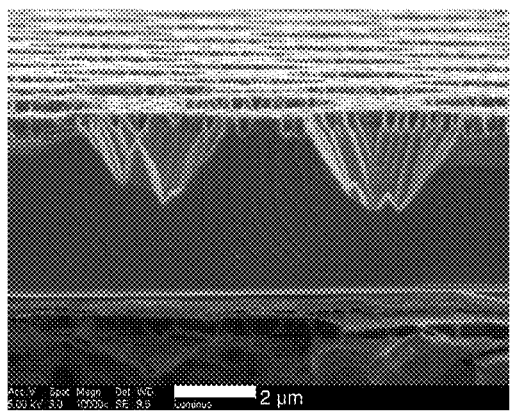
FIGS. 5A-5D include, according to another set of embodiments, SEM images of an etched GaN surface.
Figure 5B:
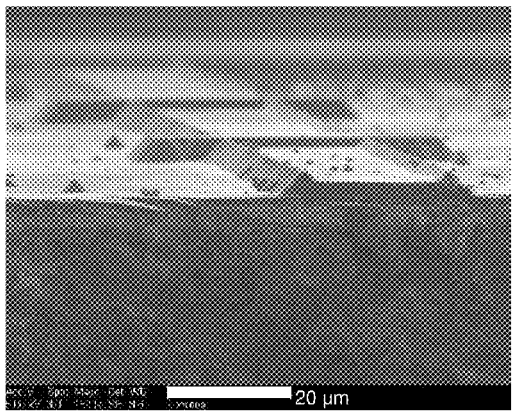
Figure 5C:
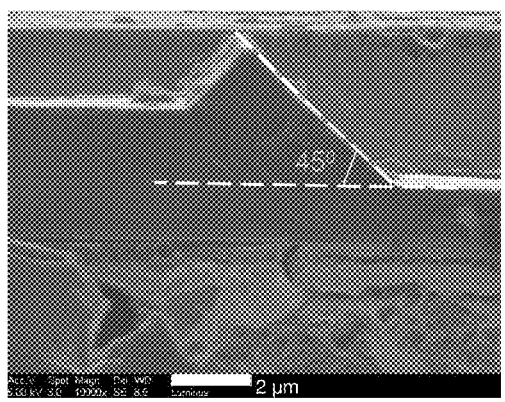
Figure 5D:
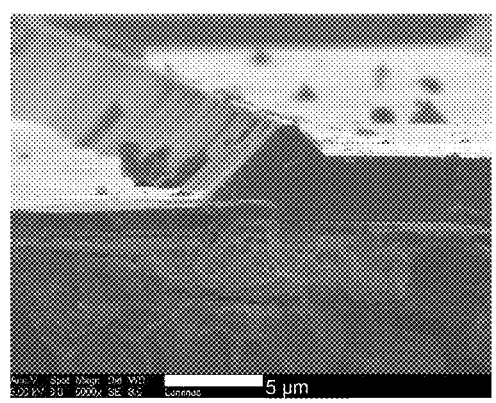

FIGS. 5A-5D include SEM images of another experiment in which a patterned GaN epitaxial layer was exposed to the etchant for 120 minutes at 80° C. FIG. 5A includes an SEM image of the surface prior to applying the etchant. FIGS. 5B-5D include images of the surface after 120 minutes of exposure. FIGS. 5B-5D show that the surface of the GaN layer was flattened after exposure to the etchant, and, in some areas, a 45° sidewall was formed.

Figure 6A:
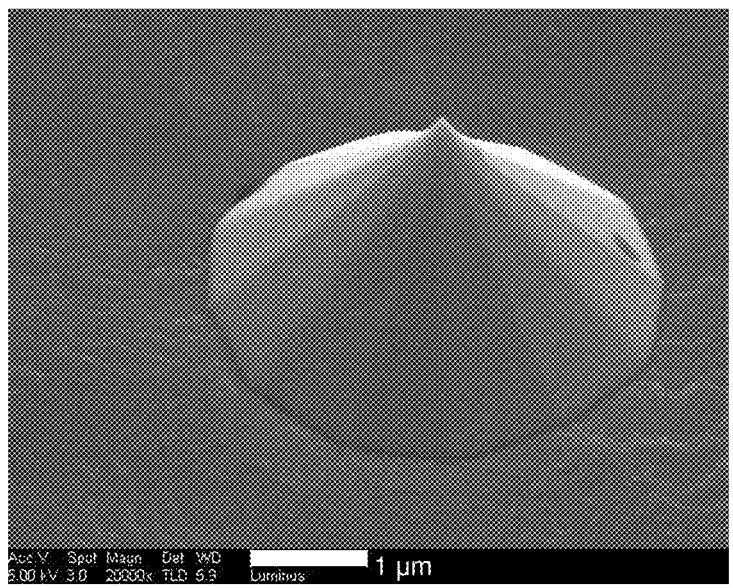
FIGS. 6A-6B include SEM images of a surface feature formed by etching a GaN surface, according to another set of embodiments.
Figure 6B:
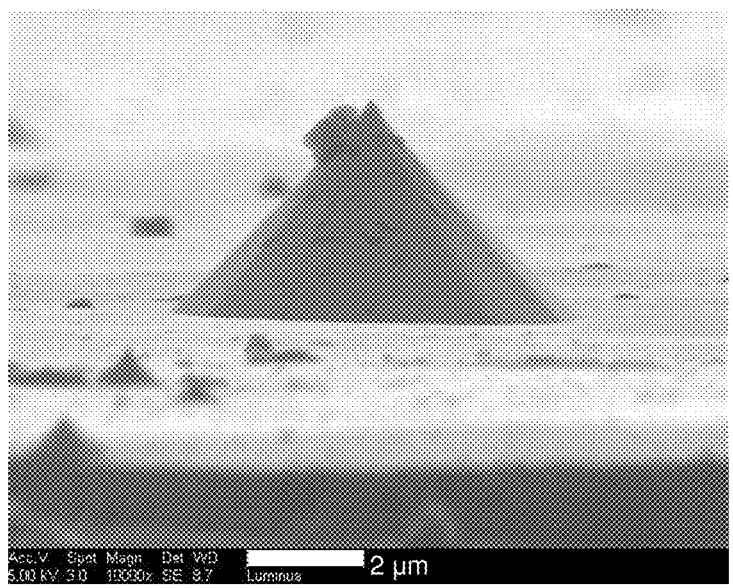

FIGS. 6A-6B include SEM images of another experiment in which a patterned GaN layer was exposed to the etchant. In this experiment, the GaN surface included projections with 14, 45°-sloped facets. The features illustrated in FIGS. 6A-6B could potentially be used to enhance light extraction from the emitting surface of a GaN LED.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. A method, comprising:
providing a first multi-layer stack, comprising:
a substrate including a patterned surface; and
a light generating region;
removing the substrate from the first multi-layer stack to form a second multi-layer stack; and
smoothening an emission surface of a GaN layer of the second multi-layer stack by wet etching the emission surface of the GaN layer, wherein all of the smoothening of the emission surface is achieved by wet etching and the emission surface is not mechanically polished; and
forming an LED configured to emit light generated by the light generating region through the emission surface.

2. The method of claim 1, wherein the substrate comprises sapphire, silicon, and/or silicon carbide.

3. The method of claim 1, wherein wet etching the emission surface of the GaN layer of the second multi-layer stack is performed in the absence of dry etching.

4. The method of claim 1, wherein the first multi-layer stack comprises a sacrificial layer.

5. The method of claim 4, wherein removing the substrate from the first multi-layer stack comprises decomposing at least a portion of the sacrificial layer.

6. The method of claim 1, wherein wet etching the emission surface of the GaN layer of the second multi-layer stack comprises wet etching an emission surface of the GaN layer of the second multi-layer stack that is exposed upon removal of the substrate.

7. The method of claim 1, wherein wet etching comprises exposing the emission surface of the GaN layer of the second multi-layer stack to an etchant comprising an acid and/or an oxidizing agent.

8. The method of claim 7, wherein the acid comprises phosphoric acid and/or nitric acid.

9. The method of claim 7, wherein the oxidizing agent comprises hydrogen peroxide and/or nitric acid.

\* \* \* \* \*